United States Patent [19]

Pelly

[11] Patent Number: 4,540,899
[45] Date of Patent: Sep. 10, 1985

[54] HAMMER DRIVE CIRCUIT USING POWER MOSFETS

[75] Inventor: Brian R. Pelly, Palos Verdes Estates, Calif.

[73] Assignee: International Rectifier Corporation, Los Angeles, Calif.

[21] Appl. No.: 431,057

[22] Filed: Sep. 30, 1982

[51] Int. Cl.³ .............................................. H03K 17/60
[52] U.S. Cl. .................................... 307/270; 307/571; 400/166
[58] Field of Search .......................... 400/157.2, 166; 101/93.29; 307/270, 571; 361/152, 153

[56] References Cited

U.S. PATENT DOCUMENTS 4,262,592  4/1981  Araki ................................. 101/93.03

FOREIGN PATENT DOCUMENTS 12710  11/1979  Japan ................................. 361/154
2020503  11/1979  United Kingdom ................. 361/156

OTHER PUBLICATIONS

Krausse, Electronics, Power MOSFETs Run Directly Off TTL, Aug. 28, 1980, pp. 145-147, vol. 53, No. 19.

Primary Examiner—Stanley D. Miller
Assistant Examiner—B. P. Davis
Attorney, Agent, or Firm—Ostrolenk, Faber, Gerb & Soffen

[57] ABSTRACT

An energizing circuit for printer hammer drive coils is provided in which a single MOSFET transistor and a single diode is employed for each drive coil. Two voltage source means, one of which may be a capacitor, are connected in series. The drive coil is connected in series with the single MOSFET transistor and one of the voltage sources and is energized when the transistor is on. The drive coil discharges in a series circuit including the diode and the other of the voltage sources and charges the later voltage source when the transistor is off. An energy recuperation circuit is disclosed for receiving energy from the later voltage source and returning it to the first voltage source.

16 Claims, 9 Drawing Figures

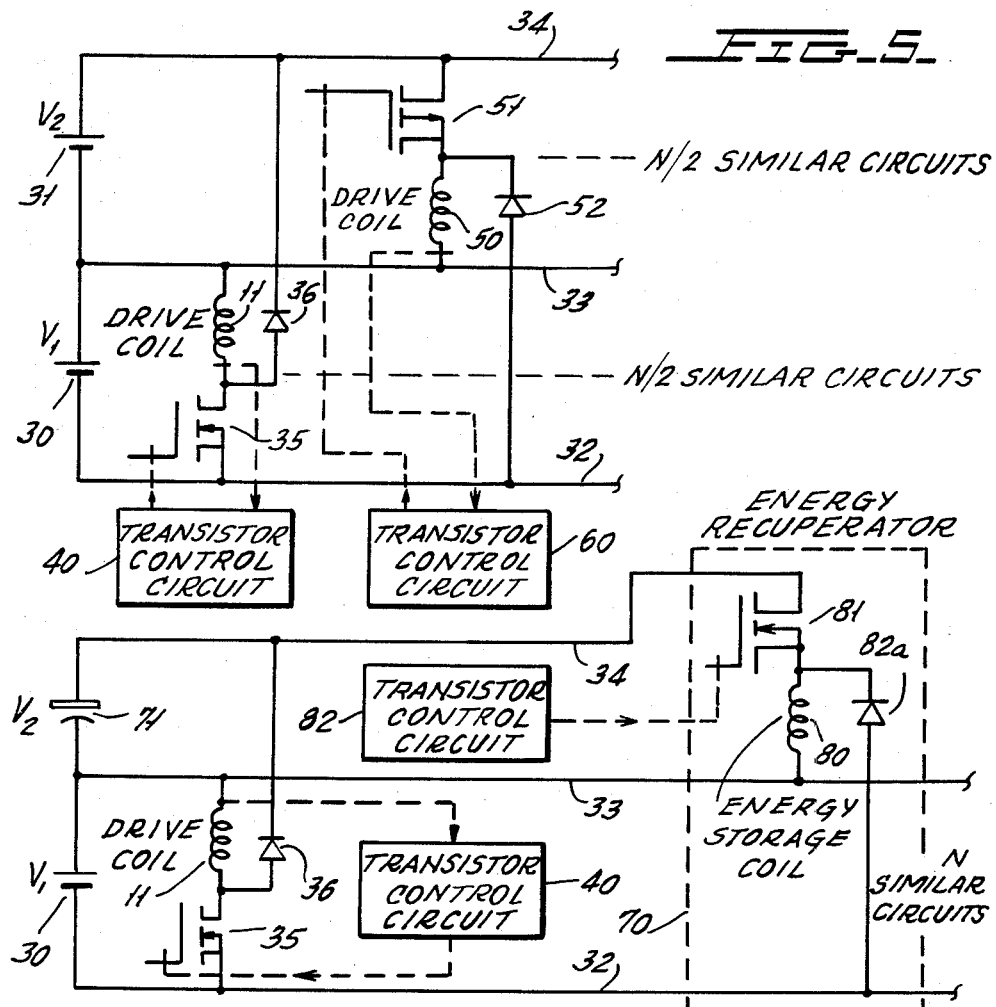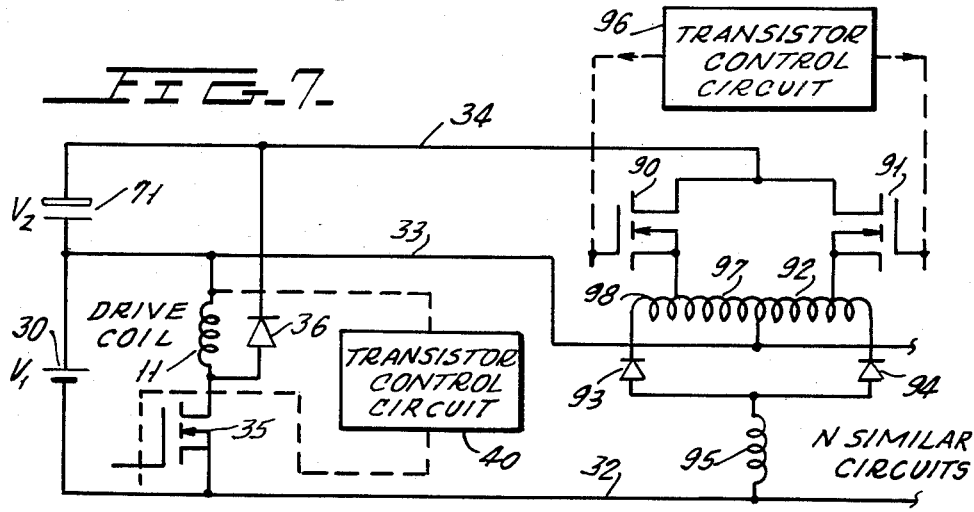

HAMMER DRIVE CIRCUIT USING POWER MOSFETS

BACKGROUND OF THE INVENTION

This invention relates to a novel control circuit for energizing an inductive load, and more particularly relates to a novel power source and energizing circuit for the inductive drive coils of printer hammers.

Circuits for controlling printer hammer drives are well known. These circuits commonly employ transistors which develop a current pulse which is applied to the printer hammer drive or other similar inductive load. Commonly, two transistors and two associated diodes are provided for each drive coil. The transistors are turned on and off in a sequence to produce a rapidly rising current pulse which stays on for a given time and, after a predetermined time, is turned off with a sharply declining current wave shape. During the time the pulse current flows, the transistors are controlled to keep the pulse current between predetermined maximum and minimum values.

Identical pairs of transistors and diodes are provided for each of a large number of drive coils of a given printer. Commonly, sets of 64 drive coils and hammers are provided for a typical printer. Since four discrete components are required for each coil, the circuits are costly, relatively unreliable and inefficient.

BRIEF SUMMARY OF THE INVENTION

In accordance with the present invention, a novel circuit is provided for the energization of a plurality of inductive loads such as the drive coils of printer hammers, wherein only a single transistor and single diode is required for each drive coil. A common terminal of each of the drive coils of the circuit of the present invention is connected to a common busbar extending from the junction of two voltage source means, one of which can be a capacitor. Preferably, the transistor for each drive coil is a MOSFET type transistor since a relatively high frequency is produced within each current pulse in the mode of operation of the novel circuit.

The single MOSFET transistor is connected in a closed series circuit with the first voltage source and the drive coil. This circuit is switched on and off by the transistor in order to produce the pulse and to maintain the pulse current between predetermined maximum and minimum current levels during the duration of the current pulse. Once the current pulse is completed, the single transistor turns completely off. When the transistor turns off, current produced by the stored energy in the drive coil flows through the diode into the second voltage source means.

The second voltage source means may be associated with a plurality of drive circuits in which the functions of the first and second voltage sources described above is reversed. Alternatively, when the second voltage source means is a capacitor, a single energy recuperation circuit can be employed to return the energy discharged from the drive coils into the capacitor when its respective transistor is off back to the first voltage source.

The circuit of the present invention reduces the number of control components to one-half of those of the prior art since only one transistor and one diode is required for each drive coil. Moreover, the same terminal of each drive coil of the system is connected to a common conductor. These features result in circuit simplification, better efficiency, higher reliability and lower system cost.

BRIEF DESCRIPTION OF THE DRAWINGS

FIG. 2b shows the voltage across the drive coil on the same time base as that of FIG. 2a.

FIG. 4b shows the voltage across the drive coil on the same time base as that of FIG. 4a.

FIG. 5 is a circuit diagram of a second embodiment of the invention, wherein one-half of the drive coils is connected across a first voltage source and the other half of the drive coils is connected across a second voltage source.

FIG. 6 is a circuit diagram of a third embodiment of the invention wherein one of the two voltage sources is a capacitor and wherein a single energy recuperator circuit is provided for each of the individual drive coil circuits.

FIG. 7 is a circuit diagram of a fourth embodiment of the invention wherein the energy recuperator circuit of FIG. 6 is modified to employ two transistors with an auto-transformer coupling the transistors to the drive circuits.

DETAILED DESCRIPTION OF THE DRAWINGS

Figure 1:
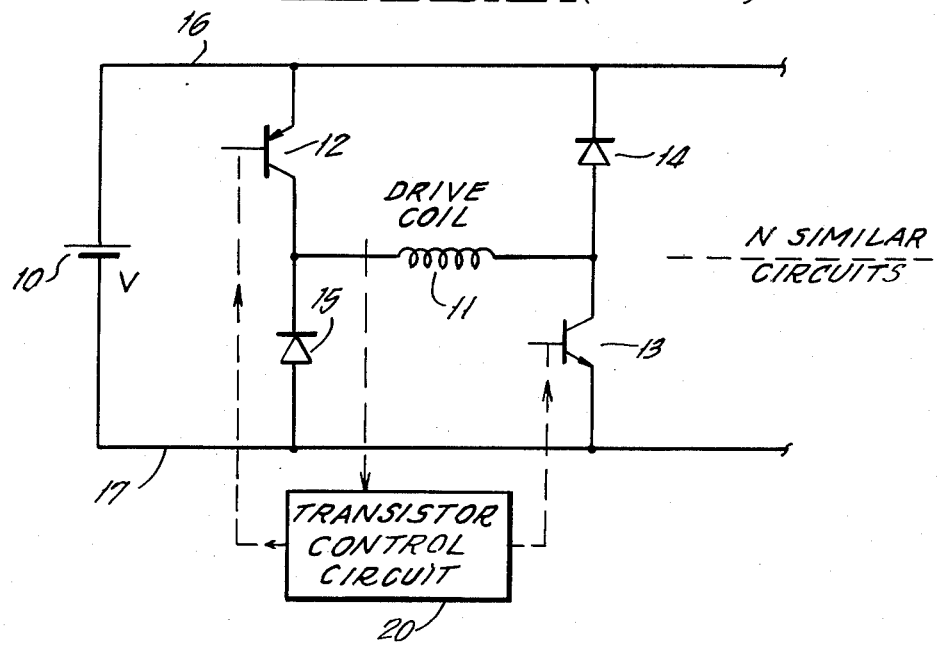
FIG. 1 is a circuit diagram of a prior art drive circuit for a printer hammer drive in which the circuit is shown for only a single drive coil.

Referring first to FIG. 1, there is shown a prior art circuit for a printer hammer drive in which a conventional d-c source 10 is connected to energize drive coil 11 through the control circuit consisting of bipolar transistors 12 and 13 and diodes 14 and 15. The control circuit is connected across conductors or buses 16 and 17 which continue to the right of the circuit and have connected thereacross some number N of similar but preferably identical circuits for N drive coils. Typically, 64 drive coils would be used.

Figure 2A:
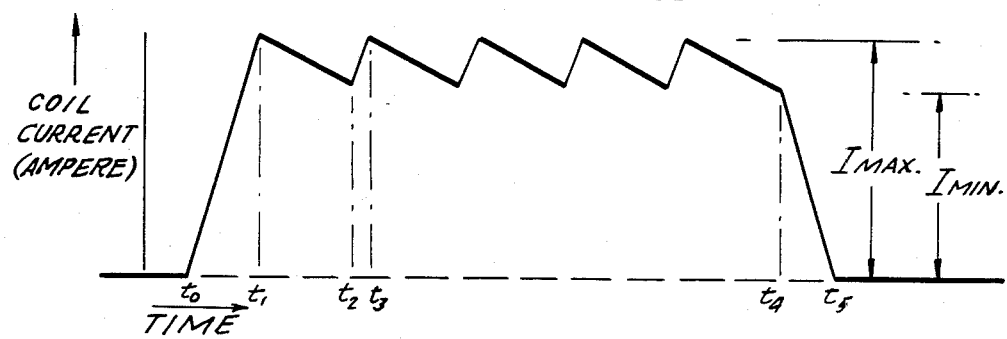
FIG. 2a shows a single, typical current pulse in the drive coil of FIG. 1.
Figure 2B:
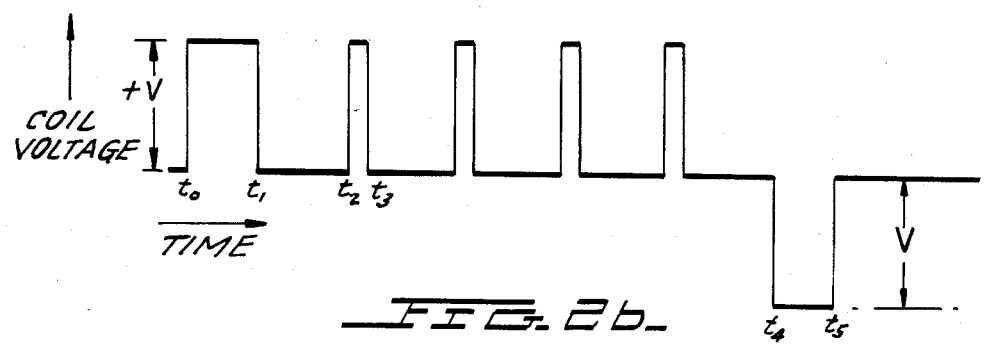

A suitable transistor control circuit 20 is connected to the base leads of transistors 12 and 13 and applies control signals to switch transistors 12 and 13 on and off in a sequence which is shown in FIGS. 2a and 2b for a single pulse. The sequence is started at time $t_0$ when some input signal, such as a printing signal, is produced which calls for a current pulse in the drive coil 11. Following this input signal, which may be developed from the control circuit 20, a current pulse having a current lower than $I_{max}$ and greater than $I_{min}$, shown in FIG. 2a, will be produced for a given time. When an off-signal is produced by circuit 20, transistors 12 and 13 turn fully off and terminate the pulse. During the pulse time of FIG. 2a, transistor 12 is switched on and off at relatively high frequency, in response to the measured current in drive coil 11, as will be described.

The operation of the circuit of FIG. 1 is as follows:

During the period $t_0$ to $t_1$, transistors 12 and 13 are both switched on. The supply voltage of source 10 is applied across the drive coil 11 and the current in coil 11 rises rapidly, as shown in FIG. 2a.

At the time $t_1$, the current reaches a predetermined peak value $I_{max}$. This current level is measured by a suitable feedback circuit connected to the transistor control circuit 20 and, in response to this situation at time $t_1$, transistor 12 is switched off. The current through the drive coil 11 will then circulate through transistor 13, which is still on, and the diode 15 during the period $t_1$ to $t_2$.

At time $t_2$, the current through the drive coil 11 has decayed to the predetermined minimum level $I_{min}$ and the transistor 12 is switched on by the transistor control circuit 20. The coil current in drive coil 11 will then begin to raise again toward the value $I_{max}$ during the period $t_2$ to $t_3$. At time $t_3$, the current in coil 11 reaches $I_{max}$ and transistor 12 switches off again.

The above sequence continues until the time $t_4$ when it is desired to switch off the current in drive coil 11. At this time, transistor control circuit 20 produces a signal to switch off both transistors 12 and 13. The current in the drive coil 11 then flows back into the power supply 10 through diodes 14 and 15. Because of the reversal of the voltage across the drive coil following time $t_4$, the coil current is reduced rapidly to zero at time $t_5$.

Figure 3:
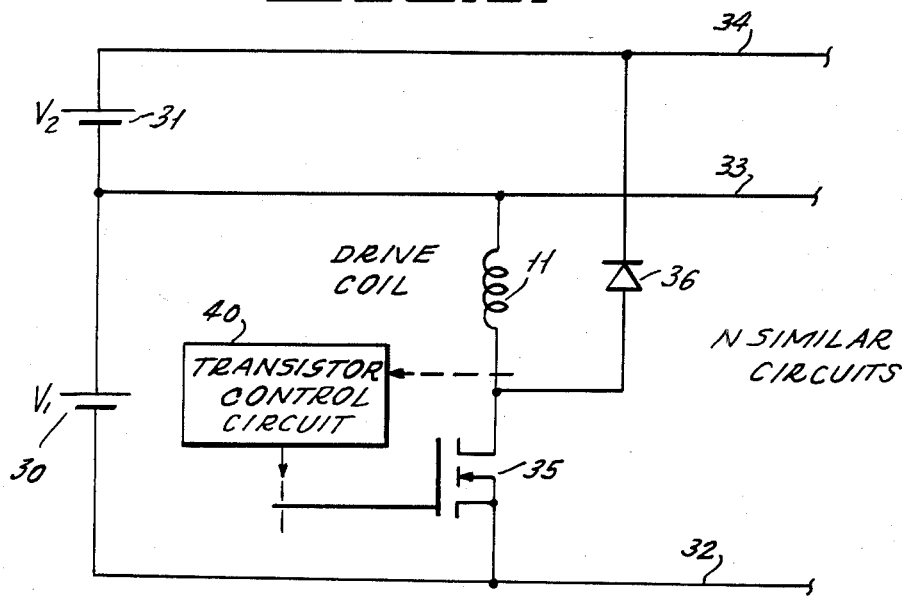
FIG. 3 is a circuit diagram of the circuit of the present invention.

In accordance with the present invention, a novel drive circuit for the drive coil 11 is provided where only a single transistor and single diode is needed for each drive coil. FIG. 3 is a circuit diagram of the novel circuit of the invention and shows a single drive coil 11. Included in the circuit are two d-c power supplies 30 and 31 having voltages of $V_1$ and $V_2$, respectively. Three conductors 32, 33 and 34 extend from voltage sources 30 and 31 which are preferably low impedance sources. While any desired voltage can be selected for the power supplies 30 and 31, the power supplies may typically have voltages of 50 volts and 30 volts, respectively. The exact values of the voltages selected depend on the particular design, and the voltages could be equal if desired. A single transistor 35 is connected in closed series relationship with the drive coil 11 and voltage source 30. A single diode 36 is connected in closed series relationship with the drive coil 11 and the second voltage source 31. Note that any desired number N of identical circuits having respective drive coils 11, transistors 35 and diodes 36 can be connected to the conductors 32, 33 and 34, as shown for the single set of elements in FIG. 3.

A transistor control circuit 40 is provided to control the turn-on and turn-off of transistor 35 in response to externally produced signals which call for energization of coil 11. Circuit 40 also has feedback means for responding to the instantaneous current measured in the drive coil 11 (or a facsimile thereof) during the duration of the current pulse through the drive coil.

Figure 4A:
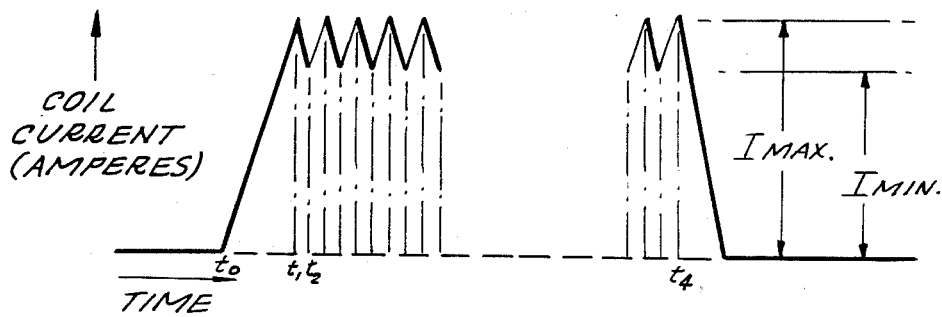
FIG. 4a shows the wave shape of a single current pulse in the drive coil of FIG. 3.
Figure 4B:
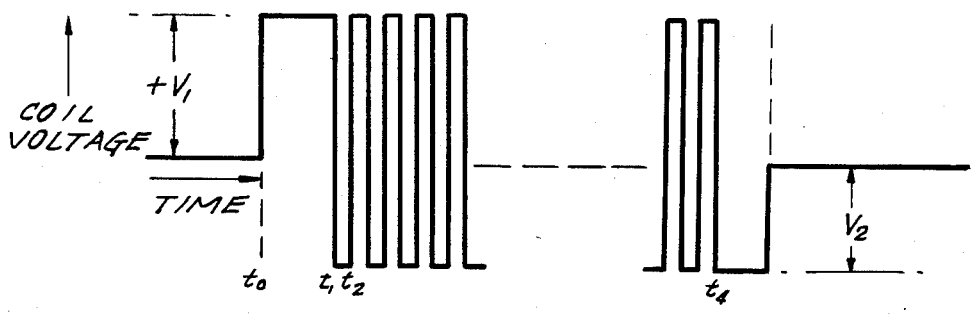

The operation of the circuit of FIG. 3 may be best understood from FIGS. 4a and 4b. The waveforms of FIGS. 4a and 4b are also idealized waveforms, as will be apparent.

In order to initially energize drive coil 11, the single transistor 35 is turned on by the transistor control circuit 40 at time $t_0$. The current through drive coil 11 then rises rapidly from time $t_0$ to $t_1$. At time $t_1$ the current $I_{max}$ of FIG. 4a is reached. Transistor control circuit 40 then shuts off transistor 35 and, during this off period, the current through drive coil 11 is switched into diode 36 and into the source 31.

At time $t_2$, the current through the coil 11 is reduced to its pedetermined minimum level $I_{min}$. The transistor control circuit 40 then turns the transistor 35 back on.

This sequence then continues until the time $t_4$ of FIGS. 4a and 4b when the transistor control circuit 40 puts out a signal to completely turn off the coil current. The transistor 35 is then switched off and remains off. Coil current through the coil 11 flows into the voltage source 31, decaying rapidly due to the reverse voltage across the coil 11.

It should be noted that the voltage of source 31 need not be equal to the voltage of source 30 and, preferably, is less since less voltgage is required to drive down coil current in the given time than to force it up, due to losses in the coil 11. Also, by using the smallest possible voltage for source 31, the peak voltage across transistor 35 is minimized.

A major advantage of the circuit of FIG. 3 over that of FIG. 1 is that only a single transistor 35 and single diode 36 are needed, rather than the two transistors and two diodes of the circuit of FIG. 1. In addition, all of the common terminals of each drive coil 11 of FIG. 3 for the N identical circuits are connected to a common busbar 33. These features result in circuit simplification, better efficiency, higher reliability and lower system cost.

To implement the novel circuit of FIG. 3, it is preferable to employ a MOSFET device, rather than a bipolar device for the transistor 35. Thus, transistor 35 is shown as a MOSFET device in FIG. 3. The reason for this is that the ripple current frequency during the current pulse between $I_{max}$ and $I_{min}$ is much greater than that of the circuit of FIG. 1 because the coil current in the circuit of FIG. 3 is rapidly forced down by the voltage $V_2$ rather than being allowed to float around a local free-wheeling circuit as in FIG. 1. Typically, for example, this ripple frequency might be 100 to 200 kHz as compared to 10 to 30 kHz. for the circuit of FIG. 1. If a conventional bipolar transistor is employed for the transistor 35 in FIG. 3, it would produce high switching losses. A power MOSFET device, however, such as a HEXFET MOSFET device of one of types IRF510, IRF520 or IRFD1Z0 is manufactured by the International Rectifier, Corporation, of El Segundo, Calif., is capable of operating at the frequency needed for the circuit of FIG. 3, and generally at much higher frequencies than a bipolar transistor without high switching losses.

In the circuit of FIG. 3, the power supply 31 must act as an energy sink during the time that transistor 35 is off during the current flow interval. Numerous circuit configurations, based on the concept of the circuit of FIG. 3, can be employed to overcome the problem of using the power supply 31 as an energy sink.

One manner of solving this problem is by dividing each of a large number of similar circuits in half, with one-half of the circuits connected across the voltage source 30 and the other half connected across the voltage source 31, as will be described in connection with FIG. 5. In this case, both voltage sources, on the average, act as energy sources and neither is required to absorb energy and the voltages $V_1$ and $V_2$ are equal. A second solution employs a separate single energy recuperator circuit which absorbs the energy delivered by the drive coils to the voltage source $V_2$ and returns this energy back to the voltage source $V_1$.

FIG. 5 shows a first modification of the circuit of FIG. 3, wherein N identical circuits are divided between the two voltage sources 30 and 31 of FIG. 3. In FIG. 5, components identical to those of FIG. 3 are given similar identifying numerals. A second drive coil and operating circuit therefor is added with the drive coil 50 and MOSFET device 51 in closed series with the voltage source 31. A diode 52 is connected in closed series with drive coil 50 and the voltage source 30. Thus, it will be seen that the control circuit for energizing drive coil 11 is repeated for one-half of all of the identical circuits in connection with the voltage source $V_2$. The transistor control circuit 60 is also added which is substantially identical to circuit 40 for transistor 35.

In the operation of the circuit of FIG. 5, the same switching sequence as in FIG. 3 is used for each circuit, except that one-half of the circuits takes energy from the first power source 30 and delivers it to the second power source 31, while the other half of the circuits takes energy from the upper power source 31 and delivers it to the lower source 30. Because of losses in the circuit, both sources 30 and 31 act as energy sources and neither is required to absorb energy. Note that in the circuit of FIG. 5, MOSFET device 51 is shown as a P-channel type device, while device 35 is shown as an N-channel device. Clearly, however, either P or N channel devices could be used for transistors 35 and 51 with suitable control circuitry for the transistor control circuits 40 and 60.

FIG. 6 shows a further embodiment of the invention which avoids using the upper voltage source as an energy sink, wherein essentially the same circuit as that of FIG. 3 is employed for each of N similar circuits but a single energy recuperator circuit, shown in the block 70, is connected to the system. In addition, the upper voltage source 31 of FIGS. 3 and 5 is replaced by a voltage source means which takes the form of a capacitor 71. In the circuit of FIG. 6, all coil drive circuits are powered from the voltage source 30. The separate recuperator circuit 70 operates to return the energy received by the upper voltage source means or capacitor 71 back to voltage source 30. Only a single energy recuperator circuit 70 is needed for the N coil drive circuits, so that the added complexity of the recuperator circuit, in terms of an overall system which might employ 64 drive coils and circuits therefor, is slight.

The recuperator circuit 70 of FIG. 6 employs an energy storage coil 80 and transistor 81 which are connected in closed circuit relationship with the capacitor 71. While transistor 81 is shown as a MOSFET transistor, bipolar transistors could be used. A diode 82a is connected in closed series relationship with the energy storage coil 80 and the voltage source 30. A transistor control circuit 82 is connected to the gate of transistor 81 and the transistor 81 is turned cyclically on and off at a repetition frequency, such as 20 to 200 hz. The switching of transistor 81 is independent of the switching of transistor 35 because the energy recuperation circuit need not follow the instantaneous fluctuation of energy delivered to source $V_2$ by the drive coils because the energy fluctuation is smoothed by capacitor 71. Thus, the energy storage coil 80 is used to store energy taken from the capacitor 71 during the on period of transistor 81 and return it to the voltage source 30 during the off period of transistor 81 through the diode 82a.

FIG. 7 shows a modification of the energy recuperator circuit of FIG. 6. In FIG. 7, components similar to those of FIG. 6 have similar identifying numerals. However, the energy recuperator circuit employs two transistors 90 and 91 which are connected to taps of an auto-transformer 92. Transistors 90 and 91 may be MOSFET or bipolar transistors. The center tap of the auto-transformer 92 is connected to conductor 33 and the ends of the winding of auto-transformer 92 are connected to the diodes 93 and 94. The anodes of diodes 93 and 94 may be connected to conductor 32 either directly or through an inductance 95. In the circuit of FIG. 7, a control circuit 96 is provided to control the conduction of transistors 90 and 91 so that transistors 90 and 91 are alternately driven on and off, each having 180° conduction, at some suitable but non-critical frequency which might be from 20 kHz. to 200 kHz.

The voltage $V_2$ of capacitor 71 in FIG. 7 can be less than the output voltage of source 30 by a factor equal to the turns ratio of the auto-transformer 92 between the turns in winding segment 97 and the total turns of winding segments 97 and 98, where segment 98 contains the turns between the end of the winding and the connection of transistor 90, while segment 97 contains the turns between the connection point of transistor 90 and the winding center tap.

When the voltage across capacitor 71, multiplied by the turns ratio of the auto transformer 92, is less than the output voltage $V_1$ of power supply 30, current from capacitor 71 cannot flow into the source 30 because diodes 93 and 94 are reverse biased. Therefore, the voltage across capacitor 71 increases as the capacitor is charged from current from the lower circuit. Once the voltage across capacitor 71 exceeds a given value equal to the voltage of source 30 multiplied by the turns ratio of transformer 92, diodes 93 and 94 conduct, thereby returning the energy from capacitor 71 to the source 30 and clamping the voltage $V_2$ across capacitor 71 at a desired level.

If desired, a smoothing inductor 95 can be employed to smooth the current and prevent excessive peak loading.

Note that, if desired, the energy delivered to voltage source $V_2$ in the above embodiments can be dissipated as by connecting a suitable energy discharge circuit in parallel with the source. By way of example, a zener diode can be connected across capacitor 71, or a circuit including a zener diode and series resistor can be connected in parallel with capacitor 71 and the collector-emitter circuit of a bipolar transistor. The base of the latter transistor can be connected to the junction of the zener diode and resistor. Such dissipation circuits will dissipate energy while keeping the voltage $V_2$ nominally constant.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. A circuit for a repetitively energized inductive load; said circuit including a transistor, a diode, first and second d-c voltage source means, and transistor control circuit means operable to turn said transistor on and off and to cycle said transistor between on and off conditions when the current through said inductive load attempts to fall below a prescribed minimum and rise above a pescribed maximum value respectively, or in response to alternatively derived timing signals which achieve essentially the same result, said transistor being cycled at a cycle rate of greater than about 100 kHz; said first voltage source means, said inductive load and said transistor connected in a first closed series relationship; said first and second voltage source means connected in series with one another with additive polarities, whereby, when said transistor is on, current flows from said first voltage source means, through said inductive load, and when said transistor then turns off, current flows through said diode and into said second voltage source means in a direction to oppose said current flow.

2. The circuit of claim 1, wherein said transistor is a MOSFET device.

3. The circuit of claim 1 or 2, wherein said inductive load is a printer hammer coil.

4. The circuit of claim 1, wherein said second voltage source means includes a capacitor.

5. The circuit of claim 3 which further includes a plurality of hammer coils, and a respective plurality of transistors and diodes for each of said hammer coils; each set of said hammer coils, transistor and diode connected to one another and to said first and second voltage source means in identical manners.

6. The circuit of claim 5, wherein each of said transistors is a MOSFET device.

7. The circuit of claim 5, wherein said second voltage source means includes a capacitor.

8. The circuit of claim 1, which further includes a second inductive load, a second transistor and a second diode; said transistor control circuit means connected to said second transistor and controlling the turning on and off of said second transistor, said second transistor being cycled on and off at a cycle rate of greater than about 100 kHz; said second transistor, said second inductive load and said second voltage source means connected in a third closed series relationship; said first voltage source means, said second inductive load and said second diode connected in a fourth closed series relationship, whereby when said second transistor is on, current flows from said second voltage source means and through said second inductive load, and when said transistor turns off, current flows through said second diode and into said first voltage source means with the voltage of said first voltage source means in a direction to oppose said last-mentioned current flow.

9. The circuit of claim 8, wherein said transistor and said second transistor are MOSFET devices.

10. The circuit of claim 8, wherein said inductive load and said second inductive load are printer hammer coils.

11. The circuit of claim 10 which further includes, in parallel with said sets of hammer coils, transistors and diodes, respective pluralities of hammer coils, and a respective plurality of transistors and diodes for each of said hammer coils; each set of said hammer coil, transistor and diode connected to one another and to said first and second voltage source means in identical manners.

12. The circuit of claim 11, wherein each of said transistors is a MOSFET device.

13. The circuit of claim 7 which further includes a respective circuit which comprises a second inductive load, a second transistor and a second diode; said transistor control circuit means connected to said second transistor and controlling the turning on and off of said second transistor; said second transistor, said second inductive load and said second voltage source means connected in a third closed series relationship; said first voltage source means, said second inductive load and said second diode connected in a fourth closed series relationship, whereby when said second transistor is on, current flows from said second voltage source means and through said second inductive load, and when said transistor turns off, current flows through said second diode and into said first voltage source means with the voltage of said first voltage source means in a direction to oppose said last-mentioned current flow.

14. The circuit of claim 13, wherein each of said transistors is a MOSFET device.

15. The circuit of claim 13, wherein each of said inductive loads, other than said second inductive load, consists of respective printer hammer coils.

16. The circuit of claim 7 which further includes an energy recuperative circuit; said recuperative circuit comprising second and third MOSFET transistors, transformer winding means and second and third diodes; said second and third transistors connected from one terminal of said capacitor to respective terminals of said transformer means; said second and third diodes connected from one terminal of said first voltage source means to respective terminals of said transformer means; the opposite terminals of said first voltage source means and said capacitor connected to one another and to a terminal of said transformer means.

* * * * *